United States Patent [19]

Cheng et al.

[11] Patent Number: 5,395,791
[45] Date of Patent: Mar. 7, 1995

[54] GROWTH OF II VI LASER DIODES WITH QUANTUM WELLS BY ATOMIC LAYER EPITAXY AND MIGRATION ENHANCED EPITAXY

[75] Inventors: Hwa Cheng, Woodbury; James M. DePuydt, St. Paul; Michael A. Haase; Jun Qiu, both of Woodbury, all of Minn.

[73] Assignee: Minnesota Mining and Manufacturing Company, St. Paul, Minn.

[21] Appl. No.: 139,614

[22] Filed: Oct. 20, 1993

Related U.S. Application Data

[63] Continuation of Ser. No. 887,541, May 22, 1992, abandoned.

[51] Int. Cl.$^6$ .......................................... H01L 21/203
[52] U.S. Cl. ..................................... 437/105; 437/129; 437/133; 117/104; 257/15
[58] Field of Search .................... 437/105, 129, 133; 257/15; 156/610, DIG. 72, DIG. 77; 117/104

[56] References Cited

U.S. PATENT DOCUMENTS 4,261,771  4/1981  Dingle et al. ...................... 156/610
5,045,897  9/1991  Alhgren .
5,068,867  11/1991  Hasenberg et al. .................. 257/18

FOREIGN PATENT DOCUMENTS 0284031  9/1988  European Pat. Off. .

OTHER PUBLICATIONS

Journal of Crystal Growth, vol. 101, No. 1/4, Apr. 1, 1990, pp. 81-85.
Journal of Crystal Growth, vol. 117, No. 1/4, Feb. 1992, p. 1077.
Applied Physics Letters, vol. 56, No. 9, Feb. 26, 1990, pp. 848-850.
Applied Physics Letters, vol. 60, No. 17, Apr. 27, 1992, pp. 2045-2047.
"Short Wavelength II-VI Laser Diodes", by Haase et al., Inst. Phys. Conf. Ser. No. 120: Chapter 1, Paper presented at Int. Symp. GaAs and Related Compounds, Seattle, 1991.
"Dynamic Reflection High-Energy Diffraction Observations of the Atomic Layer Epitaxy Growth of Zn Chalcogenides", by Takafumi Yao, Japanese Journal of Applied Physics, vol. 25, No. 12, Dec. 1986.
"Excitonic Trapping From Atomic Layer Epitaxial ZnTe within ZnSe(Zn,Mn)Se Heterostructures", by Kolodziejski et al., American Institute of Physics, Appl. Phys. Lett. 52 (13), 28 Mar. 1988.
"Atomic Layer Epitaxial Growth of ZnSe, ZnTe, and ZnSe-ZnTe Strained-layer Superlattices", by Dosho et al., American Institute of Physics, J. Appl. Phys. 66 (6), 15 Sep. 1989.
Outline entitled "Hot-Exciton Luminescence in ZnSe/CdS3 Digital Alloy Quantum Wells", by A. Pareek et al., Bulletin of the American Physical Society, Mar. 1992, vol. 37, No. 1.
Pessa et al. "Atomic layer Epi and characterization of . . . grown on CdTe (100) substrates" J. Appl. Phys. vol. 54 (10), 1983 p. 6047.
Takeda et al. "Atomic layer Epi of ZnSe and ZnTe single crystal films and its appln to ZnSe/ZnTe superlattices" extended abstracts of 17th Conf. on Solid State Devices and Materials, Tokyo (Japan) 1985, pp. 221-224.

*Primary Examiner*—Robert Kunemund
*Assistant Examiner*—Ramamohan Rao Paladugu
*Attorney, Agent, or Firm*—Gary L. Griswold; Walter N. Kirn; Lorraine R. Sherman

[57] ABSTRACT

A method for using atomic layer epitaxy (ALE) and/or migration enhanced epitaxy (MEE) to grow high efficiency quantum wells in II-VI laser diodes. The substrate and previously grown layers of the laser diode are heated to a temperature less than or equal to about 200° C. in an MBE chamber. Sources of Cd, Zn, and Se are injected alternately into the chamber to grow a short-period strained-layer superlattice (SPSLS) quantum well layer including overlaying monolayers of Cd, Zn and Se. The quantum well layer is described by the notation $[(CdSe)_m(ZnSe)_n]_p$ where m, n and p are integers.

20 Claims, 4 Drawing Sheets

GROWTH OF II VI LASER DIODES WITH QUANTUM WELLS BY ATOMIC LAYER EPITAXY AND MIGRATION ENHANCED EPITAXY

This is a continuation of application Ser. No. 07/887,541, filed May 22, 1992, now abandoned.

BACKGROUND OF THE INVENTION

Research undertaken by 3M in St. Paul, Minn., culminated in the demonstration of the world's first laser diodes fabricated from II–VI semiconductor materials. These devices emit coherent radiation at 490 nm in the blue-green portion of the spectrum. They are disclosed generally in the Qiu et al. U.S. patent application Ser. No. 07/700,580, filed May 15, 1991 now U.S. Pat. No. 5,213,998, and entitled *Method For Making An Ohmic Contact For P-Type Group II–VI Compound Semiconductors*, and the Haase et al. article *Short Wavelength II–VI Laser Diodes*, Conference Proceedings for Gallium Arsenide and Related Compounds, 1991 Institute of Physics Conference Series, No. 120, pp 9–16.

The light-generating (active) layers in the above-described laser diodes include strained $Cd_xZn_{1-x}Se$ single quantum wells grown by conventional molecular beam epitaxy (MBE) techniques. Unfortunately, the composition and thickness of the random CdZnSe alloy is difficult to control by this process. Luminescence efficiency is also relatively poor. These characteristics limit the overall efficiency of the devices.

It is evident that there is a continuing need for improved laser diodes. For wide spread commercial viability, the devices must be capable of efficiently generating high intensity beams of light at room temperatures. Fabrication techniques for laser diodes having these characteristics are also needed.

SUMMARY OF THE INVENTION

The present invention is an improved method for operating a molecular beam epitaxy (MBE) system of the type having a chamber and sources of at least one group II and at least one group VI elements to grow a quantum well active layer on a semiconductor body for a II–VI compound semiconductor electroluminescent device, such as a laser diode. The substrate and previously grown layers of the II–VI semiconductor device are heated in the MBE chamber. The group II and group VI elements are injected alternately into the chamber to grow a quantum well layer including at least two overlaying monolayers of the group II and group VI elements. In one embodiment, the substrate and previously grown layers of the device are heated to a temperature of about 150° C., while Cd, Zn and Se are injected alternately into the chamber to produce a laser diode active layer including a CdSe/ZnSe short-period strained-layer superlattice (SPSLS) quantum well layer described by the notation $[(CdSe)_1(ZnSe)_2]_3$. Prototypes of laser diodes fabricated through the use of this technique exhibit greater room temperature photoluminescence and electroluminescence intensities than those described in the Background Of The Invention section, yet operate at lower threshold currents.

DETAILED DESCRIPTION OF THE PREFERRED EMBODIMENTS

Figure 1:
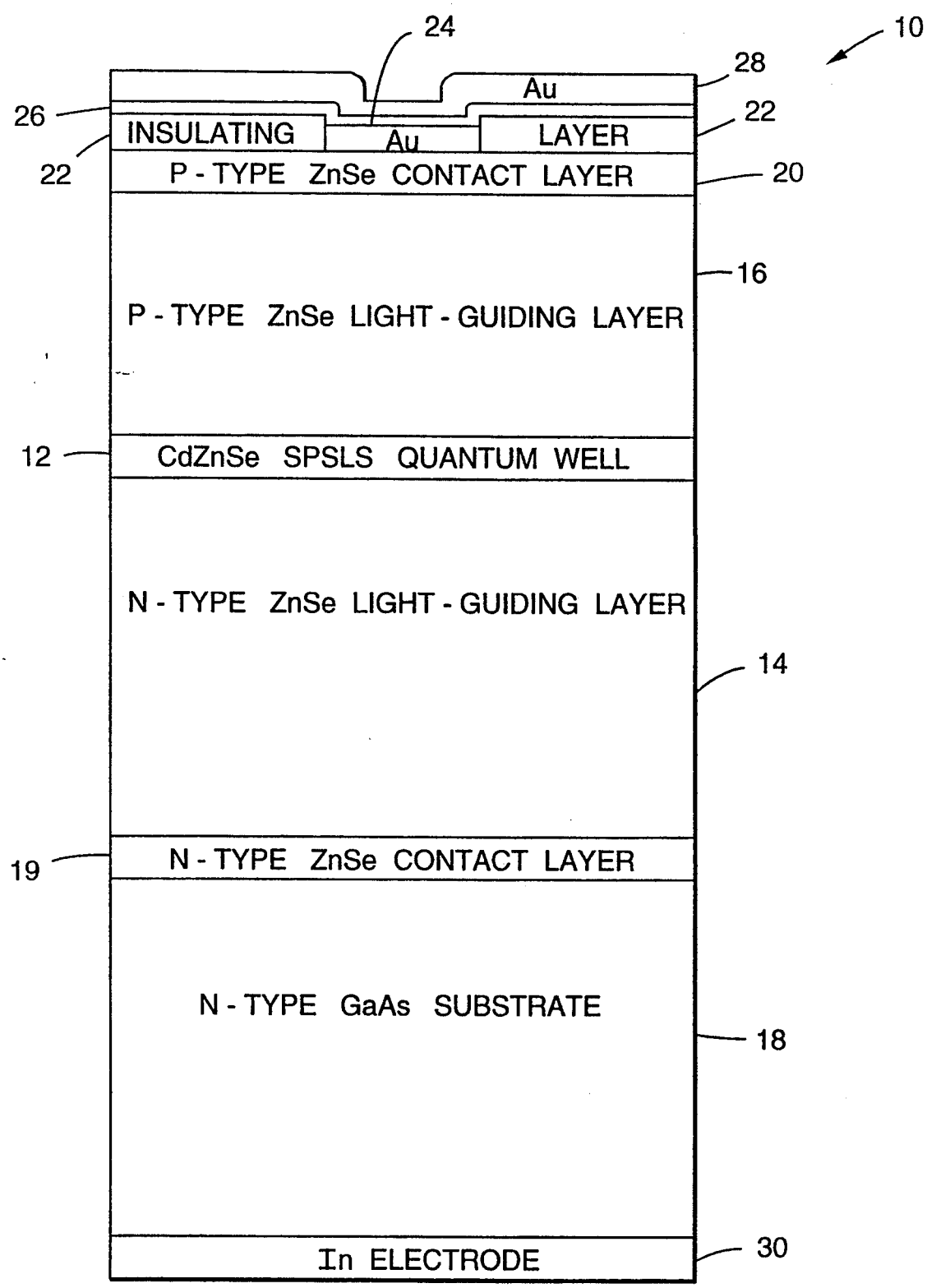
FIG. 1 is a cross sectional view (not to scale) illustrating the structure of a II–VI semiconductor laser diode in accordance with the present invention.

A II–VI compound semiconductor laser diode 10 (i.e., an electroluminescent device) in accordance with the present invention is illustrated generally in FIG. 1. Laser diode 10 includes a short-period strained-layer superlattice (SPSLS) quantum well layer 12 surrounded by a ZnSe pn junction formed by n-type ZnSe light-guiding layer 14 and p-type ZnSe light-guiding layer 16. As described in greater detail below, quantum well layer 12 is a high efficiency active layer grown by atomic layer epitaxy (ALE) and/or migration enhanced epitaxy (MEE). Laser diode 10 is fabricated on an n-type GaAs substrate 18 and includes an n-type ZnSe ohmic contact layer 19 between the substrate and guiding layer 14. A p-type ZnSe ohmic contact layer 20 overlays p-type guiding layer 16. A polyimide insulating layer 22 covers the surface of ohmic contact layer 20 opposite light-guiding layer 16.

Electrical contact to p-type ohmic contact layer 20 is made by Au electrode 24, which is formed in an open stripe in insulating layer 22. A thin Ti layer 26 and a final Au layer 28 are applied over insulating layer 22 to facilitate lead bonding. Electrical contact to the lower side of laser diode 10 is made by an In electrode 30 on the surface of substrate 18 opposite n-type ohmic contact layer 19.

Light-guiding layer 14 and contact layer 19 are both doped n-type with Cl in prototypes of laser diode 10. Light-guiding layer 16 and ohmic contact layer 20 are doped p-type with N in these prototypes. The net donor concentration to which the lower light-guiding layer 14 is doped is $1 \times 10^{17}$ cm$^{-3}$, while the upper light-guiding layer 16 is doped to a net acceptor concentration of $2 \times 10^{17}$ cm$^{-3}$. Ohmic contact layers 19 and 20 are both deposited to a thickness of 0.1 $\mu$m in the prototype devices. The lower contact layer 19 is doped n-type to a net donor concentration of $1 \times 10^{18}$ cm$^{-3}$. The upper contact layer 20 is doped p-type to a net acceptor concentration of $1 \times 10^{18}$ cm$^{-3}$.

Light generated in quantum well active layer 12 is guided within light-guiding layers 14 and 16, clad only by the GaAs substrate 18 and the Au electrode 24. Good optical confinement and sufficiently low loss are obtained in laser diode 10 without the need for II–VI semiconductor cladding layers. Computer modeling is used to select appropriate thicknesses for light-guiding layers 14 and 16. This modeling approach takes into account the ZnSe waveguide formed by light-guiding layers 14 and 16, as well as the complex indices of refraction of GaAs substrate 18 and Au electrode 24. Modeling methods of this type are generally known and disclosed, for example, in M. R. Ramdas et al., *Analysis of Absorbing and Leaky Planar Waveguides: A Novel Method,* Optics Letters, Vol. 14, p. 376 (1989) and the references cited therein.

Figure 2:
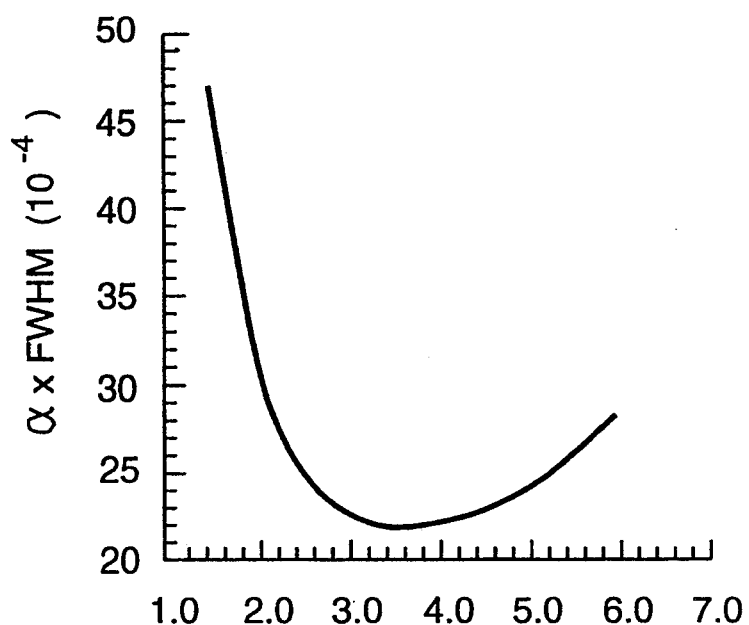
FIG. 2 is a graph illustrating the product of the loss coefficient ($\alpha$) and the full width at half maximum (FWHM) intensity of the optical mode as a function of the thickness of the light-guiding layers, for laser diodes of the type shown in FIG. 1.

FIG. 2 is a graph illustrating the product of the loss coefficient ($\alpha$) and the full width at half maximum intensity (FWHM) of the desired optical mode (TE polarized for the prototypes described herein) as a function of the thickness of the ZnSe layers 14 and 16 (FIG. 1). To minimize the threshold current density of the device, this product should be minimized. Using this design criterion and the information shown in FIG. 2, the thickness of the waveguide (i.e., the combined thicknesses of light-guiding layers 14 and 16) is approximately 3.5 $\mu$m in the prototype laser diode 10. In this embodiment, n-type light-guiding layer 14 has a thickness of 2.0 $\mu$m, while p-type light-guiding layer 16 has a thickness of 1.5 $\mu$m. The loss due to free-carrier absorption and scattering is estimated to be 8 cm$^{-1}$ in this embodiment. Quantum well layer 12 has only a relatively small effect on the loss and optical confinement characteristics of the device, and its presence is neglected during the design procedure described above. Theory suggests that total waveguide thicknesses less than 2.0 $\mu$m result in excessive absorption losses in substrate 18 and electrode 24. At a thickness of 2.5 $\mu$m, the substrate and electrode absorption losses are 11.7 cm$^{-1}$. On the other hand, the FWHM of the optical mode is found to be almost exactly half of the waveguide thickness. Therefore, for thicknesses greater than about 6 $\mu$m the optical confinement is so poor that the single quantum well layer 12 cannot practically supply enough gain to overcome the losses. The maximum modal gain is inversely proportional to the FWHM of the waveguide mode. For a waveguide that is 6 $\mu$m thick, the FWHM is about 3 $\mu$m, and the modal gain from a single quantum well can be estimated to be 12 cm$^{-1}$. See e.g., N. K. Dutta, Applied Physics Letters, vol. 53, p. 72 (November 1982).

Figure 3:
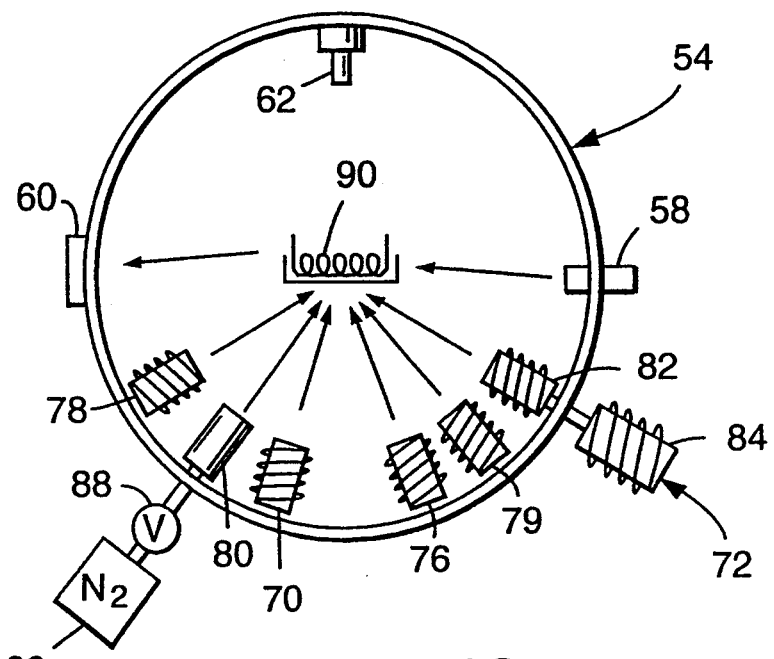
FIG. 3 is an illustration of a molecular beam epitaxy (MBE) system that can be used to fabricate laser diodes in accordance with the present invention.

FIG. 3 is an illustration of a molecular beam epitaxy (MBE) system used to fabricate the prototypes of laser diode 10 described above. The MBE system includes a chamber 54 with a high energy electron gun 58, a phosphorus screen 60, a substrate heater 90 and a flux monitor 62. MBE chambers such as 54 are generally known and commercially available.

Prototypes of laser diode 10 are fabricated on Si-doped n$^+$-type GaAs substrates 18 having a (100) crystal orientation. Substrates of this type are commercially available. Substrate 12 is cleaned and prepared using conventional or otherwise known techniques, and mounted to a Molybdenum sample block (not shown in FIG. 3) by In solder before being positioned within chamber 54.

Chamber 54 includes a Zn effusion cell 70, cracked-Se effusion cell 72, Cd effusion cell 76 and a standard Se (i.e., primarily Se$_6$) effusion cell 79. As shown, cracked-Se effusion cell 72 includes a bulk evaporator 84 and high temperature cracking zone 82, and provides a source of cracked Se (including Se$_2$ and other Se molecules with less than 6 atoms). The bulk evaporator 84 and high temperature cracking zone 82 used to produce the prototype laser diodes 10 are of a custom design, the details and capabilities of which are described in the Cheng et al. article, *Molecular-Beam Epitaxy Growth Of ZnSe Using A Cracked Selenium Source,* J. Vac. Sci. Technol., B8, 181 (1990). C1 effusion cell 78 which utilizes ZnCl$_2$ source material provides the C1 n-type dopant. The p-type dopant is provided by N free-radical source 80. Free-radical source 80 is connected to a source 86 of ultra-pure N$_2$ through leak-valve 88. The free-radical source 80 used in the fabrication of laser diodes 10 is commercially available from Oxford Applied Research Ltd. of Oxfordshire, England (Model No. MPD21). The beam exit plate at the end of the source is made of pyrolyric boron nitride (PBN) and has nine 0.2 mm diameter holes through it. This source is mounted on a standard port for an effusion cell through a 10" extension tube. N$_2$ source 86 used to fabricate laser diodes 10 is of research purity grade. The pressure at the inlet of the leak-valve of source 86 is 5 psi.

MBE chamber 54 is operated in a manner described in the Cheng et al. article *Growth Of p- and n-Type ZnSe By Molecular Beam Epitaxy,* J. Crystal Growth 95, 512 (1989) using the Se$_6$ source 79 as the source of Se to grow the n-type contact and light-guiding layers 19 and 14, respectively, of the prototype laser diode 10.

Figure 4:
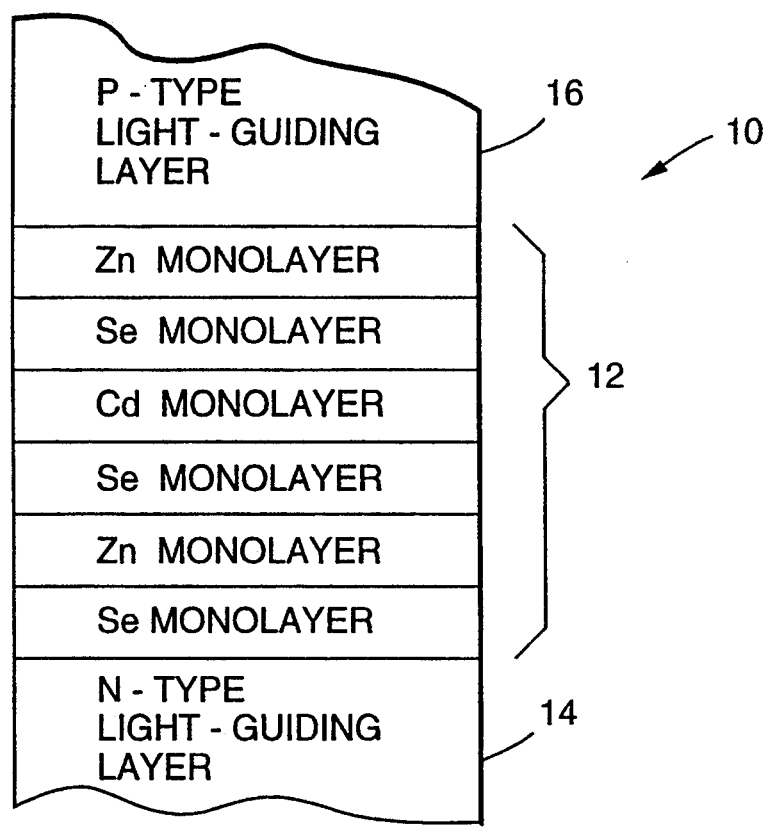
FIG. 4 is a detailed cross sectional view of the quantum well layer shown in FIG. 1.

SPSLS quantum well layer 12 is grown on the light-guiding layer 14 of laser diode 10 using atomic layer epitaxy (ALE) and/or migration enhanced epitaxy (MEE). Using these techniques, which are generally known, quantum well layer 12 is formed as a series of overlaying single crystal thickness layers (i.e., monolayers) of Cd, Zn and Se. A detailed illustration of quantum well layer 12 is shown in FIG. 4. In this embodiment, quantum well layer 12 includes adjacent monolayers of Cd and Se between a pair of adjacent monolayers of Zn and Se. This structure can be described generally by the following notation:

$$[(CdSe)_m(ZnSe)_n]_p$$

where: m, n and p are integers.

Figure 6:
FIG. 6 is a high resolution transmission electron micrograph of a cross-section of the quantum well of a laser diode fabricated in accordance with the present invention.

In the embodiment illustrated in FIG. 4, m=1, n=2, and p=1. In other embodiments (not shown) m=1, n=1-5 and p=1-5. The equivalent Cd concentration in quantum well layer 12 is determined by the ratio of the number of CdSe layers to the total number of layers (including both ZnSe and CdSe) in the quantum well layer. Total thickness of quantum well layer 12 is given by the number of monolayers grown times the thickness of each monolayer. FIG. 6 is a high resolution transmission electron micrograph analysis of a cross section of a prototype laser diode 10 having a SPSLS quantum well with a period (p) equal to 6, clearly representing the monolayer structure of the quantum well.

Figure 5:
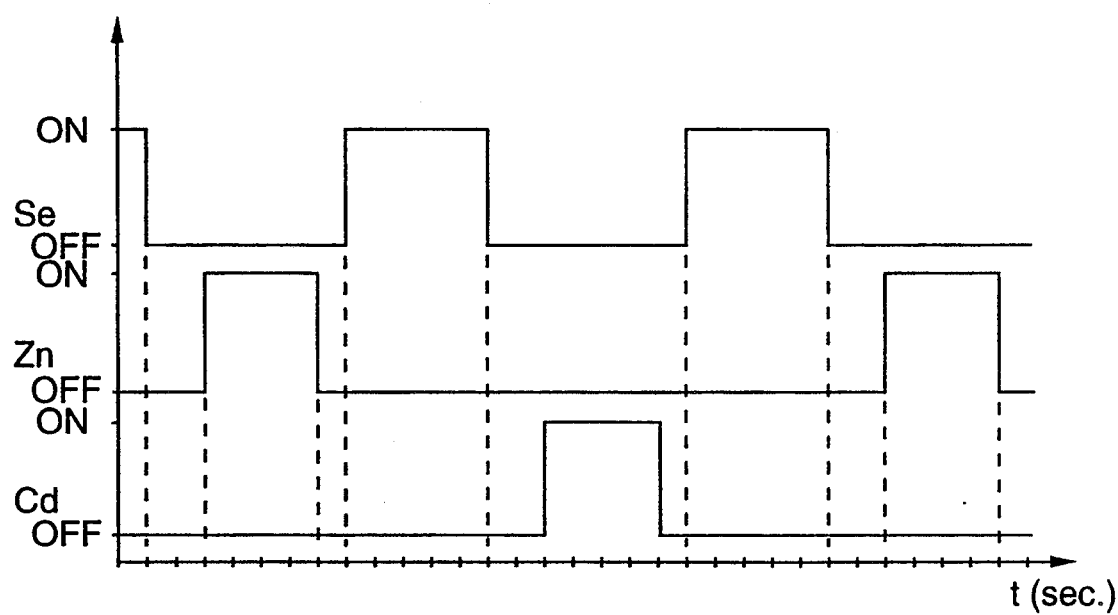
FIG. 5 is graph of the shutter sequence by which the MBE system, shown in FIG. 3, is operated to fabricate the active layer of laser diodes in accordance with the present invention.

Control over the composition and thickness of the Cd, Zn and Se monolayers of quantum well layer 12 are accurately achieved by ALE and/or MEE. Through use of these techniques, monolayer growth is controlled primarily by the sequence and timing by which the shutters (not separately shown) of the Cd, Zn and Se effusion cells 76, 70, and 72, respectively, are opened and closed. A portion of the effusion cell shutter sequence used to grow the quantum well layer 12 illustrated in FIG. 4 is shown in FIG. 5. A characteristic delay time is introduced between the sequential pulses of the reactant species to allow for the reevaporation of excess reactant.

Prototype laser diodes 10 including SPSLS quantum well layers such as that shown in FIG. 4 have been grown at temperatures of 150° C. and using the thermally cracked Se (Se$_2$) effusion cell 76. The shutter sequence begins with the Se shutter open. The Se shutter is closed after depositing at least one monolayer (about 5 seconds). The Zn shutter is then opened after a slight delay (about 2 seconds) to allow excess Se to evaporate. Next, the Zn shutter is closed after depositing at least one monolayer of Zn (about 4 seconds). A slight delay (about 1 second) is included between the closing of the Zn shutter and the reopening of the Se shutter to allow time for the evaporation of any excess Zn. Growth continues by alternately opening and closing the shutters to sequentially deposit overlaying layers of Cd, Se and Zn. The Cd shutter is opened for about 4 seconds, followed by a delay of about 1 second before the Se shutter is reopened. The sequence beginning with the open Se shutter is then repeated to complete quantum well layer 12. Other operating parameters of MBE chamber 54 used to produce the quantum well layer 12 of the prototype laser diodes 10 are as follows:

Cd beam equivalent pressure: $1.0 \times 10^{-7}$ Torr*
Zn beam equivalent pressure: $1.0 \times 10^{-7}$ Torr*
Se cracking zone temperature: 600° C.*
Se bulk evaporator temperature: 250° C.*

* parameters dependant upon specific MBE system configuration and plasma source

Prototype laser diodes 10 having SPSLS quantum well layers 12 grown in the manner describe above at 150° C. have exhibited the highest quantum efficiency. However, quantum well test wafers with SPSLS quantum well layers grown at temperatures up to 235° C. have exhibited good characteristics. Acceptable characteristics have been observed in test wafers with SPSLS quantum well layers grown at temperatures as high as 300° C. It is also anticipated that devices having desirable characteristics can be grown at temperatures less than 150° C.

MBE chamber 54 is operated in a manner described in the copending Park et al. U.S. patent application Ser. No. 07/573,428, entitled Doping Of IIB–VIA Semiconductors During Molecular Beam Epitaxy, filed on Aug. 24, 1990, and in the Park et al. article *P-type ZnSe By Nitrogen Atom Beam Doping During Molecular Beam Epitaxial Growth*, Appl. Phys. Lett. 57, 2127 (1990), using the $Se_6$ source 79 to grow the p-type light-guiding layer 16. The disclosures contained in the above-referenced Park et al U.S. patent application and article are incorporated herein by reference.

Low resistivity p-type ZnSe ohmic contact layer 20 is grown at low temperature within MBE chamber 54 utilizing the cracked Se source 72 (i.e., cracking zone 82 and evaporator 84), while at the same time doping the semiconductor material of the contact layer p-type. This low temperature growth and doping technique is described in greater detail in the commonly assigned Qiu et al. U.S. patent application Ser. No. 07/700,580, filed May 15, 1991 and entitled *Method for Making an Ohmic Contact For P-Type Group II–VI Compound Semiconductors*. The intermediate portion of the laser diode is heated to a temperature less than 250° C. but high enough to promote crystalline growth of the ZnSe doped with the N p-type dopants to a net acceptor concentration of at least $1 \times 10^{17}$ cm$^{-3}$. A net acceptor concentration of $1 \times 10^{18}$ cm$^{-3}$ was achieved in the ohmic contact layer 20 of prototype laser diodes 10, when grown at a substrate temperature of about 150° C. However, it is anticipated that ohmic contact layers 26 with acceptable characteristics can be achieved at other growth temperatures down to at least 130° C. Other operating parameters of MBE chamber 54 used to produce the ohmic contact layer 20 of the prototype laser diodes 10 are as follows:

| | |
|---|---|
| Zn beam equivalent pressure: | $1.0 \times 10^{-7}$ Torr* |
| Se cracking zone temperature: | 600° C.* |
| Se bulk evaporator temperature: | 250° C.* |
| Growth rate: | 0.3–0.6 μm/hr |
| Surface reconstruction: | Zn-stabilized |
| Nitrogen pressure in chamber: | $>3.5 \times 10^{-7}$ Torr* |
| rf power: | 150–250 W* |

*parameters dependant upon specific MBE system configuration and plasma source

Following the deposition of contact layer 20, the as yet incomplete laser diode 10 is removed from MBE chamber 54. Electrode 24 includes Au which is vacuum evaporated onto contact layer 20 and patterned into a stripe (typically about 20 μm wide) using conventional photolithography and lift-off. An insulating layer 22 is then applied over electrode 24 and the exposed surface of contact layer 20. For an insulator that can be applied at low temperatures, polyimide photoresist is preferred. Probimide 408 from Ciba-Geigy Corp. was used to produce the prototype laser diodes 10. A stripe (about 20 μm wide) of the polyimide layer 22 directly above electrode 24 is removed by UV exposure through a photomask and development using the manufacturer's recommended processing recipe, except for the post-development cure. To cure the developed polyimide, the device was flood exposed to 1 J/cm² of UV light from a mask aligner, and baked at 125° C. on a hot plate in air for 3 minutes. Ti-Au layer 26 was then evaporated on the exposed surface of the Au electrode 24 and polyimide layer 22 to facilitate lead-bonding. The In used for MBE substrate bonding also served as electrode 30 on substrate 18. Opposite ends of the device were cleaved along (110) planes to form facet mirrors. The facets were coated with a total of four alternating quarter wavelength stacks of $MgF_2$ and ZnSe to provide a 90% reflectivity. Cavity length of the prototype devices 10 is about 1000 μm. Laser diodes 10 were then bonded p-side up to ceramic sample holders with silver-filled epoxy.

Laser diodes 10 in accordance with the present invention offer considerable advantages. The ALE/MEE techniques for growing the quantum well layer enables better composition control, better control of the quantum well thickness and luminescense efficiency than random alloy quantum wells grown by conventional MBE. These characteristics are evidenced by increased room temperature photoluminescence and electroluminescence intensities, and lower laser threshold currents. Although the room temperature threshold currents in these prototype devices (as low as 1030 A/cm³) are not as low as in devices with cladding layers, these devices offer the advantages of simpler construction and lower operating voltages (about 13 V).

The embodiments described above include light guiding layers that are not lattice matched to the substrate. It is anticipated that increased device lifetime and improved performance will be exhibited by devices in which the lattice parameters of the light guiding layers are matched to that of the substrate. The first and second light guiding layer may include $ZnS_{0.06}Se_{0.94}$ or $Cd_{0.43}Zn_{0.57}S$ on GaAs substrates or ZnSe light guiding layers on $In_{0.04}Ga_{0.96}As$ or $In_{0.52}Ga_{0.48}P$ substrates. The light guiding layers may also be comprised of $ZnS_xSe_{1-x}$, $Cd_xZn_{1-x}S$, $ZnS_{1-x}Te_x$, $Zn_{1-x}Cd_xSe$, $Zn_{1-x}Mg_xS_ySe_{1-y}$ or $Cd_xZn_{1-x-y}Mg_yS$ layers lattice matched to substrates such as GaAs, AlAs, GaP, $Al_x$-$Ga_{1-x}As$, $In_xGa_{1-x}As$, $In_xAl_{1-x}As$, $In_xGa_{1-x}P$, $In_x$-$Al_{1-x}P$, $GaAs_{1-x}P_x$, $In_xGa_{1-x-y}Al_yAs$, $In_xGa_{1-x-y}Al_yP$, ZnSe or $Zn_{1-x}Cd_xS$.

Although the present invention has been described with reference to preferred embodiments, those skilled in the art will recognize that changes may be made in form and detail without departing from the spirit and scope of the invention. For example, it is expected that the inventive concepts used to fabricate the prototype laser diodes disclosed herein are well suited to the fabrication of laser diodes with ALE/MEE active layers and/or guiding layers from a wide variety of other II-VI semiconductors and alloys. These include ZnSe, ZnTe, ZnSeTe, CdS, CdZnSeTe, MgZnSe, ZnSSe, CdZnS, ZnSTe and CdZnTe.

What is claimed is:

1. A method for operating a molecular beam epitaxy (MBE) system having a chamber and sources of at least one group II element and at least one group VI element to grow a quantum well active layer on a substrate and any previously grown layers during the fabrication of a II-VI compound semiconductor electroluminescent device, including:
   heating the substrate and previously grown layers of the II-VI semiconductor device in the MBE chamber to a temperature less than 200° C.;
   injecting alternately the group II and group VI elements into the MBE chamber; and
   growing a short-period strained-layer superlattice (SPSLS) quantum well layer in a form described by the notation $[(X)_m(Y)_n]_p$ where X and Y are binary II-VI semiconductor compounds and m, n and p are integers.

2. The method of claim 1 wherein the MBE system includes sources of Cd, Zn and Se elements, and:
   injecting the elements includes injecting alternately the Cd, Zn and Se elements; and
   growing the quantum well layer includes growing a short-period strained-layer superlattice (SPSLS) including overlaying monolayers of Cd, Zn and Se in a form described by the notation $[(CdSe)_m(ZnSe)_n]_p$ where m, n and p are integers.

3. The method of claim 2 wherein growing the SPSLS quantum well layer includes growing the layer so m=1-3, n=1-5 and p=1-5.

4. The method of claim 3 wherein growing the SPSLS quantum well layer includes growing the layer so m=1, n=2 and p=3.

5. The method of claim 1 wherein the MBE system includes sources of Zn, Te and Se elements, and:
   injecting the elements includes injecting alternately the Zn, Te and Se elements; and
   growing the SPSLS quantum well layer includes growing overlaying monolayers of Zn, Te and Se in a form described by the notation $[(ZnTe)_m(ZnSe)_n]_p$ where m, n and p are integers.

6. The method of claim 5 wherein growing the SPSLS quantum well layer includes growing the layer so m=1-3, n=1-5 and p=1-5.

7. The method of claim 1 wherein heating the substrate and previously grown layers of the device includes heating the substrate and previously grown layers to a temperature less than or equal to about 190° C.

8. The method of claim 1 wherein heating the substrate and previously grown layers of the device includes heating the substrate and previously grown layers to a temperature less than or equal to about 170° C.

9. The method of claim 1 wherein heating the substrate and previously grown layers of the device includes heating the substrate and previously grown layers to a temperature less than or equal to about 150° C.

10. II-VI laser diodes manufactured in accordance with the method of claim 1.

11. A method for operating a molecular beam epitaxy (MBE) system having a chamber and sources of Cd, Se and Zn to grow a quantum well active layer on a substrate and any previously grown layers during the fabrication of a II-VI compound semiconductor laser diode, including:
   heating the substrate and previously grown layers of the II-VI laser diode in the MBE chamber;
   injecting alternately the Cd, Se and Zn into the MBE chamber; and
   growing a short-period strained-layer superlattice (SPSLS) quantum well layer formed by overlaying monolayers of Cd, Se and Zn in a form described by the notation $[CdSe)_m(ZnSe)_n]_p$ where m, n and p are integers.

12. The method of claim 11 wherein growing the SPSLS quantum well layer includes growing the layer so m=1-3, n=1-5, and p=1-5.

13. The method of claim 11 wherein growing the SPSLS quantum well layer includes growing the layer so m=1, n=2 and p=3.

14. The method of claim 11 wherein heating the substrate and previously grown layers of the semiconductor device includes heating the substrate and previously grown layers of the device to a temperature less than or equal to about 200° C.

15. The method of claim 11 wherein heating the substrate and previously grown layers of the semiconductor device includes heating the substrate and previously grown layers of the device to a temperature less than or equal to about 170° C.

16. A method for operating a molecular beam epitaxy (MBE) system having a chamber and sources of Te, Se and Zn to grow a quantum well active layer on a substrate and any previously grown layers during the fabrication of a II-VI compound semiconductor laser diode, including:
   heating the substrate and previously grown layers of the II-VI laser diode in the MBE chamber to a temperature less than 200° C.;
   injecting alternately the Te, Se and Zn into the MBE chamber; and
   growing a short-period strained-layer superlattice (SPSLS) quantum well layer formed by overlaying monolayers of Te, Se and Zn in a form described by the notation $[(ZnTe)_m(ZnSe)_n]_p$ where m, n and p are integers.

17. The method of claim 16 wherein growing the SPSLS quantum well layer includes growing the layer so m=1-3, n=1-5, and p=1-5.

18. The method of claim 16 wherein growing the SPSLS quantum well layer includes growing the layer so m=1, n=2 and p=3.

19. The method of claim 16 wherein heating the substrate and previously grown layers of the semiconductor device includes heating the substrate and previously grown layers of the device to a temperature less than or equal to about 170° C.

20. The method of claim 16 wherein heating the substrate and previously grown layers of the semiconductor device includes heating the substrate and previously grown layers of the device to a temperature less than or equal to about 150° C.

* * * * *